US012567794B2

(12) United States Patent
Lee et al.

(10) Patent No.: US 12,567,794 B2
(45) Date of Patent: Mar. 3, 2026

(54) RADIO FREQUENCY INTEGRATED GATE DRIVER FOR A POWER SWITCH DEVICE AND METHOD

(71) Applicant: Hamilton Sundstrand Corporation, Charlotte, NC (US)

(72) Inventors: Yongduk Lee, Manchester, CT (US); Joseph V. Mantese, Ellington, CT (US); Gurkan Gok, Milford, CT (US); Caroline Reilly, Chapel Hill, NC (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 47 days.

(21) Appl. No.: 18/752,418

(22) Filed: Jun. 24, 2024

(65) Prior Publication Data

US 2025/0392204 A1 Dec. 25, 2025

(51) Int. Cl.
| | |
|---|---|
| *H02M 1/08* | (2006.01) |
| *H02M 1/44* | (2007.01) |
| *H03K 17/0812* | (2006.01) |
| *H03K 17/16* | (2006.01) |

(52) U.S. Cl.
CPC .............. *H02M 1/08* (2013.01); *H02M 1/44* (2013.01); *H03K 17/08122* (2013.01); *H03K 17/162* (2013.01)

(58) Field of Classification Search
CPC .... H02M 1/08; H02M 1/44; H03K 17/08122; H03K 17/162
USPC ................................................ 327/108, 109
See application file for complete search history.

(56) References Cited

U.S. PATENT DOCUMENTS

| | | | | |
|---|---|---|---|---|
| 7,460,604 | B2 | 12/2008 | Dupuis | |
| 10,515,781 | B1 | 12/2019 | Long et al. | |
| 10,659,036 | B2 | 5/2020 | Li et al. | |
| 11,277,127 | B1 | 3/2022 | Mantooth et al. | |
| 2009/0206817 | A1 | 8/2009 | Ng et al. | |
| 2014/0009202 | A1* | 1/2014 | Nagai | H03K 17/041 |
| | | | | 327/374 |
| 2015/0234417 | A1* | 8/2015 | Kawai | G05F 5/00 |
| | | | | 323/299 |
| 2019/0229603 | A1* | 7/2019 | Dubois | H02M 1/08 |
| 2021/0226525 | A1* | 7/2021 | Peng | H02M 1/08 |
| 2022/0216784 | A1 | 7/2022 | Choi et al. | |

FOREIGN PATENT DOCUMENTS

EP 3514928 B1 3/2021

OTHER PUBLICATIONS

Nagai et al., "Drive-by-Microwave technologies for isolated direct gate drivers", 2012 IEEE MTT-S International Microwave Workshop Series on Innovative Wireless Power Transmission: Technologies, Systems, and Applications, May 2012, 4 pages.

(Continued)

*Primary Examiner* — William Hernandez

(57) ABSTRACT

A radio frequency (RF) integrated gate driver includes a galvanically-isolated (GI) waveguide and an RF rectifier. The GI waveguide is configured to receive an RF signal from an RF source and to generate a rectifier input signal based on the RF signal. The RF rectifier is configured to receive the rectifier input signal from the GI waveguide and to generate, based on the rectifier input signal, a rectifier output signal to drive a gate of a power switch device.

20 Claims, 5 Drawing Sheets

(56) References Cited

OTHER PUBLICATIONS

Nguyen et al., "Design of Isolated Gate Driver Power Supply in Medium Voltage Converters using High Frequency and Compact Wireless Power Transfer", 2019 IEEE Energy Conversion Congress and Exposition (ECCE), Sep.-Oct. 2019, 8 pages.

Lin, "Design and Implementation of a Wirelessly Powered and Controlled Gate Driver", IEEE Journal of Radio Frequency Identification, vol. 5, Issue 1, Mar. 2021, 6 pages.

Kawai et al., "A compact isolated gate driver using GaN HFETs on sapphire substrate integrated with a 5.8GHz electro-magnetic resonant coupler", 2013 IEEE International Meeting for Future of Electron Devices, Jun. 2013, 2 pages.

Batard et al., "Wireless Transmission of IGBT Driver Control", 2009 Twenty-Fourth Annual IEEE Applied Power Electronics Conference and Exposition, Feb. 2009, 6 pages.

* cited by examiner

RADIO FREQUENCY INTEGRATED GATE DRIVER FOR A POWER SWITCH DEVICE AND METHOD

TECHNICAL FIELD

This disclosure relates generally to power switch devices. More specifically, this disclosure relates to a radio frequency (RF) integrated gate driver for a power switch device and method.

BACKGROUND

Silicon Carbide (SiC) semiconductor devices, including medium voltage SiC semiconductor devices, can provide high breakdown electric field and low conduction losses. The properties of wide bandgap (WBG) and ultra-wide bandgap (UWBG) SiC semiconductor devices permit them to operate at much higher voltages, frequencies, and temperatures. This provides a pathway to more efficient, lighter, smaller, and higher temperature capable power electronics for power electronics applications.

SUMMARY

This disclosure relates to a radio frequency (RF) integrated gate driver for a power switch device and method.

In some examples, an RF integrated gate driver includes a galvanically-isolated (GI) waveguide and an RF rectifier. The GI waveguide is configured to receive an RF signal from an RF source and to generate a rectifier input signal based on the RF signal. The RF rectifier is configured to receive the rectifier input signal from the GI waveguide and to generate, based on the rectifier input signal, a rectifier output signal to drive a gate of a power switch device.

In other examples, an RF integrated gate driver includes a GI waveguide and an RF rectifier. The GI waveguide is configured to provide power isolation for the RF integrated gate driver to mitigate electromagnetic interference (EMI) noise. The GI waveguide is also configured to generate a rectifier input signal based on an RF signal. The RF rectifier is configured to rectify the rectifier input signal and to generate a rectifier output signal. The RF rectifier is also configured to drive a gate of a power switch device based the rectifier output signal.

In still other examples, a method includes receiving an RF signal from an RF source. The method also includes generating a rectifier input signal with a GI waveguide based on the RF signal. The method further includes rectifying the rectifier input signal to generate a rectifier output signal. In addition, the method includes driving a gate of a power switch device based on the rectifier output signal.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
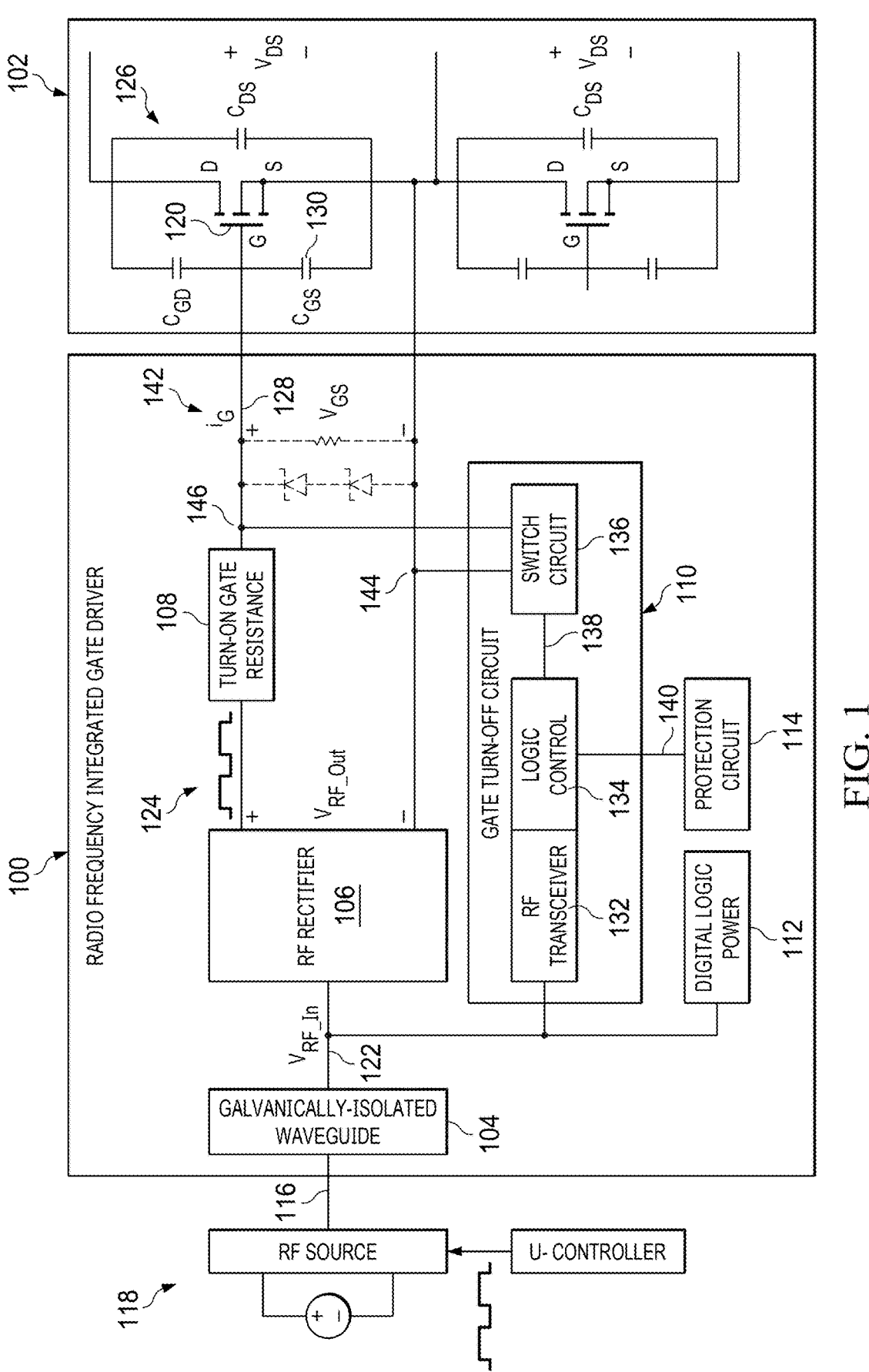
FIG. 1 illustrates an example of a schematic diagram of a radio frequency (RF) integrated gate driver for a power switch device according to this disclosure.

FIGS. 1 through 6, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, Silicon Carbide (SiC) semiconductor devices, including medium voltage (MV) SiC semiconductor devices, can provide high breakdown electric field and low conduction losses. The properties of wide bandgap (WBG) and ultra-wide bandgap (UWBG) SiC semiconductor devices permit them to operate at much higher voltages, frequencies, and temperatures. This provides a pathway to more efficient, lighter, smaller, and higher temperature capable power electronics for power electronics applications. For example, a system's power efficiency can be improved due to SiC devices' improved specific on-state resistances and lower switching energy losses. Also, the system's volume and weight can be reduced due to the smaller device size, relaxed cooling requirements, and smaller passive components. The reduced cooling requirements and smaller passive components could further reduce overall system cost. Further, existing medium and high voltage systems often use multi-level converter topologies, and an SiC device with higher voltage ratings can reduce the complexity of system circuit structures and control schemes. In addition, the power quality and dynamic response of the system can be improved by the higher operation frequencies enabled by MV SiC devices.

Unfortunately, despite superior performance, WBG devices have been slow to penetrate the market, and commercial-off-the-shelf (COTS) parts are limited to 3.3 kV. Both COTS or engineering samples (up to 10 kV) have not been widely adopted in power electronics applications, mostly due to cost, immaturity and scarcity of reliability data, and lack of manufacturing and supply ecosystems. As particular examples, electromagnetic interference (EMI) due to medium voltage switching is a significant performance limiter that limits the benefits of using MV devices, in particular. Moreover, EMI issues are partially responsible for under-utilization of current WBG devices since additional circuit complexity is needed to mitigate EMI issues.

Increasing the operating currents and voltage ratings of power electronic devices, while decreasing the switching times, results in increased currents and voltage slew rates (di/dt and dv/dt) during on-off transitions. Rapid switching can provide reduction of device switching losses, relax stringent thermal management requirements, and improve converter power density, but it can also cause radiated and conducted high-frequency EMI. This leads to noise generation, and its propagation through gate drivers, sensors, controller boards, and the like can unpredictably alter their functions and degrade converter reliability such that systems cease to function properly or experience catastrophic failures. This problem can be caused by wires or printed circuit board traces located in the vicinity of noise sources in which pulsating magnetic fluxes caused by high current slew rates can inflict significant high-frequency noise and in which any capacitive coupling establishes a path to high-frequency currents driven by high voltage slew rates. This is one factor preventing widespread adoption of WBG devices in circuits. A common mitigation technique involves slowing down switching performance by adding sufficiently large gate resistances into driving circuitry, but this negates key advantages of WBG-based devices.

This disclosure provides a radio frequency (RF) integrated gate driver that results in the ability to provide semiconductor devices and/or modules that are capable of operating at high switching frequencies with fast triggering, including at medium voltage levels, while mitigating EMI issues and reducing converter switching losses. The disclosed RF integrated gate driver has a low coupling capacitance between a power switch device and a power/signal source. In this way, high slew rates are allowed due to mitigation of EMI noise. In addition, low gate resistance is provided, resulting in low switching loss, high efficiency, and high-power density at the system level.

FIG. 1 illustrates an example of a schematic diagram of an RF integrated gate driver 100 for a power switch device 102 according to this disclosure. The example of the RF integrated gate driver 100 shown in FIG. 1 is for illustration only. Other examples of the RF integrated gate driver 100 could be used without departing from the scope of this disclosure.

According to embodiments of this disclosure, the RF integrated gate driver 100 includes a galvanically-isolated (GI) waveguide 104 and an RF rectifier 106. For the illustrated example, the RF integrated gate driver 100 also includes a turn-on gate resistance 108 and a gate turn-off circuit 110, in addition to digital logic power 112 and a protection circuit 114. The RF integrated gate driver 100 is configured to receive an RF signal 116 generated by an RF source 118 and to drive a gate 120 of the power switch device 102 based on the RF signal 116. For some embodiments, the power switch device 102 can include a medium voltage power switch device. As used herein, medium voltage (MV) refers to a voltage range from about 3.3 kV to about 15 kV. For other embodiments, the power switch device 102 can include a conventional power switch device configured to operate at a voltage of about 1700V, 1200V, 650V, or any other suitable voltage.

According to embodiments of this disclosure, the GI waveguide 104 is configured to transfer RF power and mitigate EMI noise by providing power isolation for the RF integrated gate driver 100. For some embodiments, the RF source 118 is configured to generate the RF signal 116 with a frequency of about 2.45 GHz. However, it will be understood that the RF signal 116 may have any suitable frequency. The GI waveguide 104 can mitigate conducted EMI by confining the RF power and triggering. The isolation capacitance of the GI waveguide 104 is relatively low compared to a conventional interwinding galvanically-isolated transformer. Thus, the common mode current through the GI waveguide 104 is low enough such that it can generally be neglected. The GI waveguide 104 is, thus, configured to filter selected frequencies and to provide high-isolation and low-capacitance values for the RF integrated gate driver 100. As a result, the GI waveguide 104 can protect both a high-frequency side and a low-frequency side by using high-isolated capacitance and waveguide attenuation on the low-frequency side. For some embodiments, the GI waveguide 104 can include a fiber optic waveguide, a dielectric waveguide, or any other suitable waveguide that can be galvanically isolated.

The GI waveguide 104 is configured to receive the RF signal 116 from the RF source 118 and to generate a rectifier input signal VRF in 122 based on the RF signal 116. The RF rectifier 106, which is coupled to the GI waveguide 104, is configured to receive the rectifier input signal 122 from the GI waveguide 104 and to generate a rectifier output signal VRE out 124 based on the rectifier input signal 122. Thus, the RF rectifier 106 can provide RF rectification by rectifying the rectifier input signal 122, which includes an RF wave, to generate a pulse-width modulated rectifier output signal 124. In this way, the RF rectifier 106 is configured to provide DC voltage and power to the gate 120. For some embodiments, the rectifier output signal 124 can provide voltages between a range of about −5V to about +15V. As described in more detail below, the RF signal 116 comprises a power signal and a gate signal. For some embodiments, the RF signal 116 can include a periodic RF power source signal. For these embodiments, the RF rectifier 106 can include a passive diode rectifier configured to generate the rectifier output signal 124. For other embodiments, the RF signal 116 can include a non-periodic RF power source signal. For these embodiments, the RF rectifier 106 can include an active rectifier configured to generate the rectifier output signal For the illustrated example, the power switch device 102 includes at least one Silicon Carbide (SiC) metal-oxide-semiconductor field-effect transistor (MOSFET) 126, in addition to other suitable components (not shown in FIG. 1). The turn-on gate resistance 108 is configured to provide a gate signal Vos 128 to the gate 120 during a turn-on phase of the SiC MOSFET 126. As described with reference to the rectifier output signal 124, in addition to the gate voltage Vas, the gate signal 128 can also provide a power signal for the SiC MOSFET 126. During the turn-on phase, the gate signal 128 can charge a gate-source capacitance 130 of the SiC MOSFET 126. As shown in FIG. 1 and described in more detail in connection with FIG. 5, a charging/discharging current $i_G$ 142 can also be provided to or from the SiC MOSFET 126. A high energy density can be injected in order to provide a high charging current 142 in a relatively short time when charging the gate-source capacitance 130.

According to embodiments of this disclosure, the turn-on gate resistance 108 provides a relatively low resistance. For example, for some embodiments, the turn-on gate resistance 108 can include a resistor or other suitable component providing about 202 of resistance. For other embodiments, the turn-on gate resistance 108 can include a resistor or other suitable component providing less than 1052, less than 562, or less than 362 of resistance. Because the turn-on gate resistance 108 provides a low amount of resistance, fast triggering is enabled and switching losses are substantially decreased. For example, when the turn-on gate resistance 108 provides about 262 of resistance, switching losses may be lowered by at least 30% as compared to a conventional gate driver that includes about 2002 of gate resistance. In MV applications, switching loss percentages are usually higher than conduction loss percentages. Thus, by enabling an extremely high voltage slew rate, the percentage of total power losses is reduced by using a smaller turn-on gate resistance 108.

The gate turn-off circuit 110 is coupled to the GI waveguide 104 and is configured to turn off the gate 120 by providing the gate signal Vas 128 to the gate 120 during a turn-off phase of the SiC MOSFET 126. According to embodiments of the disclosure, the gate turn-off circuit 110 includes an RF transceiver 132, logic control 134, and a switch circuit 136. The RF transceiver 132 and logic control 134 are configured to receive the rectifier input signal 122 and to generate a switch signal 138 based on the rectifier input signal 122.

The switch circuit 136, which is coupled to the RF rectifier 106 through a first gate signal node 144 and to the turn-on gate resistance 108 through a second gate signal node 146, is configured to receive the switch signal 138 from the logic control 134. During the turn-off phase, through the gate signal nodes 144 and 146, the switch circuit 136 is configured to route the current 142 through a turn-off gate resistance in the switch circuit 136, as described below in connection with FIG. 2, instead of through the turn-on gate resistance 108 in order to turn off the gate 120 and to discharge the gate-source capacitance 130 in a forced discharging approach. Thus, a high power and lower turn-off gate resistance can be used during the turn-off phase, thereby enabling a zero-gate charge by burning out the gate charge energy. This is in contrast to a conventional gate driver in which a gate charge is not zero at a unipolar gate-source voltage at the turning off of a SiC device, but technically is-5V, which is used for a zero-gate charge to avoid displacement current or uncertain charging energy.

The digital logic power 112 is coupled to the GI waveguide 104 and is configured to enable, for example, the logic control 134 and the protection circuit 114 by generating a logic voltage based on the rectifier input signal 122. For some embodiments, this logic voltage can be about 3.3V or about 5V. However, it will be understood that the logic voltage can be any suitable amount of voltage. The protection circuit 114 is coupled to the logic control 134 and is configured to protect against desaturation, short circuit, and the like. Thus, for some embodiments, the protection circuit 114 can be configured to sense current at the source of the SiC MOSFET 126 to detect a short circuit fault. Upon detecting a short circuit or other fault, the protection circuit 114 can generate a fault signal 140. This fault signal 140 can be transferred to a control board or monitoring system through the RF transceiver 132 and the GI waveguide 104. In addition, based on the fault signal 140, the switch circuit 136 can be prompted to discharge the gate-source capacitance 130 and to turn off the gate 120 through the gate signal 128, regardless of the rectifier output signal 124.

Because the GI waveguide 104 has a low coupling capacitance, common issues for conventional gate drivers, such as device failures, conductive EMI problems, and the disruption of the control signals due to common mode currents, may be greatly decreased or eliminated. Using the RF integrated gate driver 100, EMI noise can be mitigated by using a waveguide-based power and signal transfer due to a low coupling capacitance between the power switch device 102 and the RF source 118. For embodiments in which the power switch device 102 includes an MV power switch device, this allows MV switching and a high voltage slew rate and its corresponding high reliability. This configuration also provides for fast triggering of gate turn-on and turn-off with an MV power converter and a high switching frequency. For a particular example, a switching frequency of over 100 kHz can be implemented, which results in a ten times higher power density as compared to switching frequencies of less than 5 kHz, such as those used in applications having conventional gate drivers. The GI waveguide 104 and the RF rectifier 106 can also have a smaller form factor compared to conventional transformer-based gate drivers. For some embodiments, the form factor may be at least ten times smaller than a transformer-based gate driver. In addition, the relatively low resistance value of the turn-on gate resistance 108 can decrease switching losses by at least 30%, resulting in a higher efficiency and high power density at system level.

Although FIG. 1 illustrates one example of a schematic diagram of an RF integrated gate driver 100 for a power switch device 102, various changes may be made to FIG. 1. For instance, the RF integrated gate driver 100 may include additional components not shown in FIG. 1.

Figure 2:
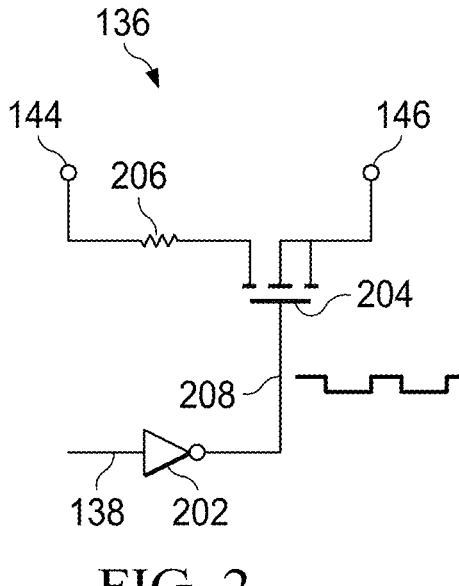
FIG. 2 illustrates an example of a schematic diagram of the switch circuit of the RF integrated gate driver of FIG. 1 according to this disclosure.

FIG. 2 illustrates an example of a schematic diagram of the switch circuit 136 of the RF integrated gate driver 100 according to this disclosure. The example of the switch circuit 136 shown in FIG. 2 is for illustration only. Other examples of the switch circuit 136 could be used without departing from the scope of this disclosure.

According to embodiments of this disclosure, the switch circuit 136 is coupled to the logic control 134 and to the gate signal nodes 144 and 146. The switch circuit 136 can include an inverter 202, a discharging switch 204, and a turn-off gate resistance 206. The inverter 202 is configured to receive the switch signal 138 from the logic control 134 and to invert the switch signal 138 to provide an inverted pulse-width modulated (PWM) signal 208 for the discharging switch 204. Thus, through the inverted PWM signal 208, the inverter 202 is configured to switch the discharging switch 204 off and on. Thus, when the RF integrated gate driver 100 is in a turn-on phase for the SiC MOSFET 126, the discharging switch 204 can be turned off. Similarly, when the RF integrated gate driver 100 is in a turn-off phase for the SiC MOSFET 126, the discharging switch 204 can be turned on, thereby providing a current path by way of the gate signal nodes 144 and 146 through the turn-off gate resistance 206 in order to turn off the gate 120 and discharge the gate-source capacitance 130 of the SiC MOSFET 126.

Although FIG. 2 illustrates one example of a schematic diagram of the switch circuit 136 of the RF integrated gate driver 100, various changes may be made to FIG. 2. For instance, the switch circuit 136 may include additional components not shown in FIG. 2.

Figure 3:
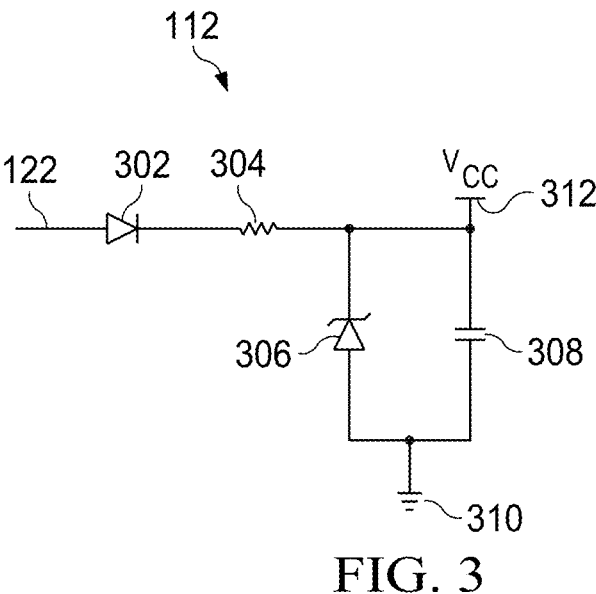
FIG. 3 illustrates an example of a schematic diagram of the digital logic power of the RF integrated gate driver of FIG. 1 according to this disclosure.

FIG. 3 illustrates an example of a schematic diagram of the digital logic power 112 of the RF integrated gate driver 100 according to this disclosure. The example of the digital logic power 112 shown in FIG. 3 is for illustration only. Other examples of the digital logic power 112 could be used without departing from the scope of this disclosure.

According to embodiments of this disclosure, the digital logic power 112 is coupled to the GI waveguide 104 and can include a rectifier diode 302, a current-limiting resistor 304, a Zener diode 306, and a storage capacitor 308. The rectifier diode 302 is configured to receive the rectifier input signal 122 at a first end of the rectifier diode 302. A second end of the rectifier diode 302 is coupled to a first end of the current-limiting resistor 304. A second end of the current-limiting resistor 304 is coupled to a first end of the Zener diode 306 and a first end of the storage capacitor 308. A second end of the Zener diode 306 is coupled to a second end of the storage capacitor 308 and to a ground potential 310. Based on the rectifier input signal 122, the digital logic power 112 is configured to generate a logic voltage $V_{CC}$ 312 for use in the RF integrated gate driver 100. For example, for some embodiments, the logic voltage 312 may be used by the logic control 134 and the protection circuit 114. However, it will be understood that the logic voltage 312 may be used by any suitable component of the RF integrated gate driver 100. For some embodiments, the logic voltage 312 can be about 3.3V or about 5V. However, it will be understood that the logic voltage 312 can be any suitable amount of voltage for use in the RF integrated gate driver 100.

Although FIG. 3 illustrates one example of a schematic diagram of the digital logic power 112 of the RF integrated gate driver 100, various changes may be made to FIG. 3. For instance, the digital logic power 112 may include additional components not shown in FIG. 3.

Figure 4:
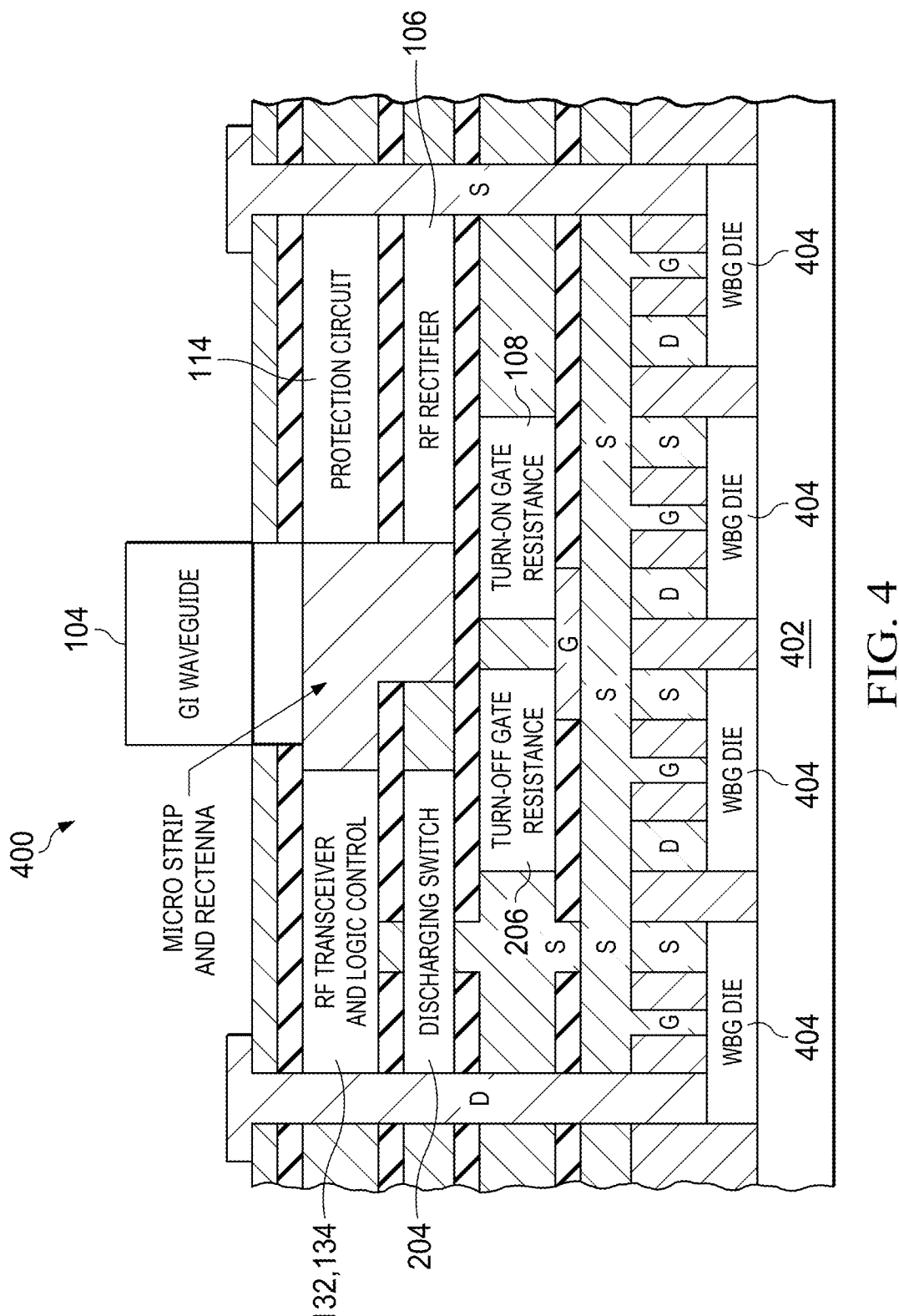
FIG. 4 illustrates an example of packaging for the RF integrated gate driver of FIG. 1 according to this disclosure.

FIG. 4 illustrates an example of packaging 400 for the RF integrated gate driver 100 according to this disclosure. The example of the packaging 400 for the RF integrated gate driver 100 shown in FIG. 4 is for illustration only. Other examples of the packaging 400 could be used without departing from the scope of this disclosure.

According to embodiments of this disclosure, the packaging 400 includes the RF integrated gate driver 100 on a substrate 402. The packaging 400 is configured to integrate the RF integrated gate driver 100 and WBG power switches 404 (such as the SiC MOSFET 126, for example) in the same packaging. For a particular example, the RF integrated gate driver 100 can be integrated into a monolithic microwave integrated circuit (MMIC) package. In power device and gating control, an embedded packaging and wafer or panel level packaging can be used. Thus, an integrated power module with a GI waveguide 104 and RF-driven gate control through an RF rectifier 106 can be provided. In this way, parasitic components can be minimized, resulting in at least ten times higher power density.

Although FIG. 4 illustrates one example of packaging 400 for the RF integrated gate driver 100, various changes may be made to FIG. 4. For instance, the packaging 400 may include a 3D heterogenous integration (3DHI) packaging or a high-power semiconductor packaging.

Figure 5:
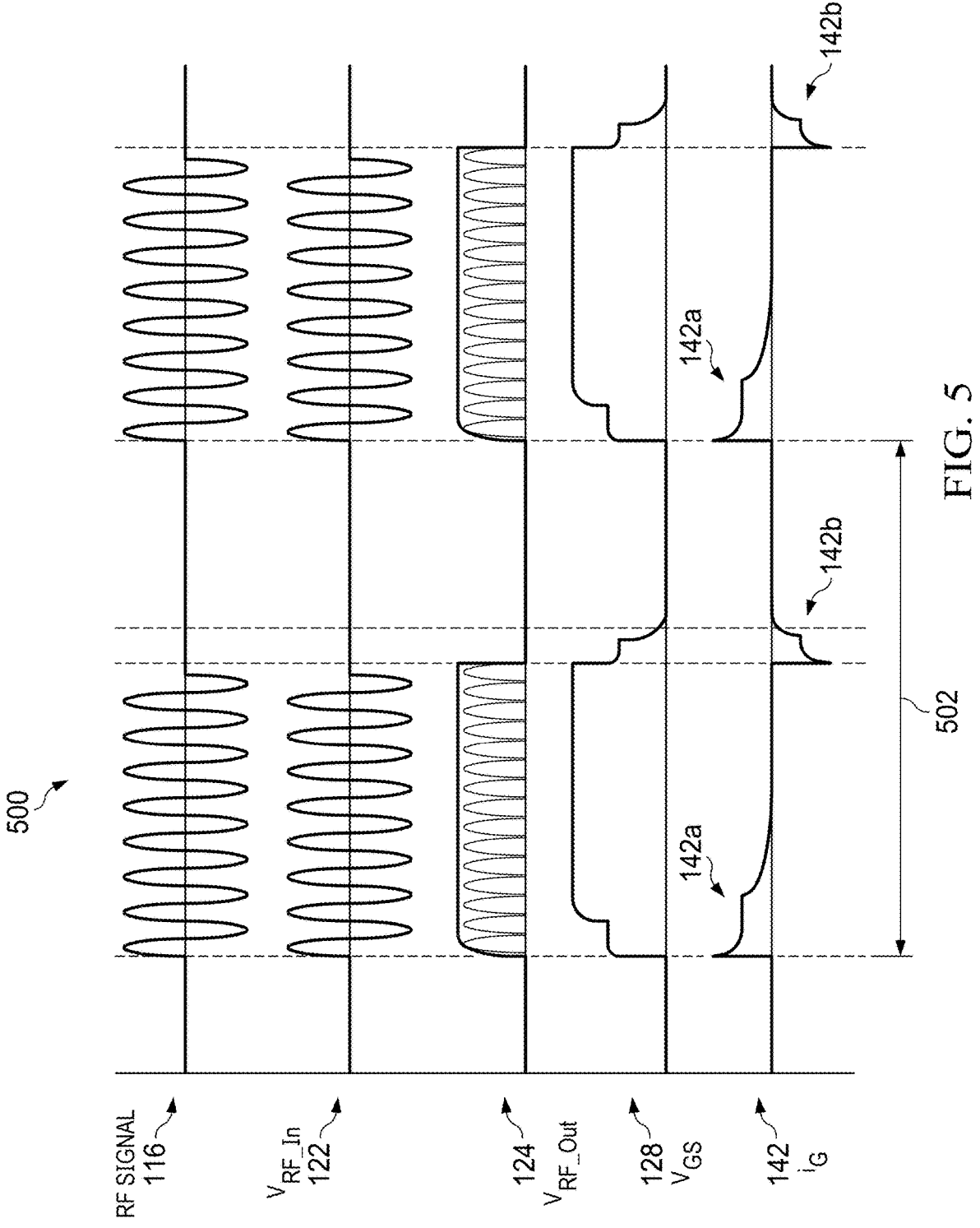
FIG. 5 illustrates an example of a timing diagram for the RF integrated gate driver of FIG. 1 according to this disclosure.

FIG. 5 illustrates an example of a timing diagram 500 for the RF integrated gate driver 100 according to this disclosure. The example of the timing diagram 500 shown in FIG. 5 is for illustration only. Other examples of the timing diagram 500 could be used without departing from the scope of this disclosure.

For the illustrated example, the RF source 118 generates the RF signal 116. For some embodiments, the RF signal 116 can include a periodic frequency of about 2.45 GHz. The GI waveguide 104 can transfer through the RF signal 116 to generate the rectifier input signal $V_{RF\_in}$ 122. The RF rectifier 106 can generate the rectifier output signal $V_{RF\_out}$ 124, which includes a periodic DC voltage, based on the rectifier input signal $V_{RF\_in}$ 122.

The gate signal Vas 128 can be provided based on the rectifier output signal $V_{RF\_out}$ 124 through the turn-on gate resistance 108 during a turn-on phase and through the turn-off gate resistance 206 during a turn-off phase. Thus, in this way, the gate-source capacitance 130 of the SiC MOSFET 126 can be charged by a periodic DC voltage through the gate signal 128 and discharged by the switch circuit 136. The charging/discharging current 142 can include a charging current 142a based on the turn-on gate resistance 108 and a discharging current 142a based on the turn-off gate resistance 206.

For some embodiments, a period 502, which corresponds to the switching frequency for the RF integrated gate driver 100, can be about 10 μs, for a frequency of 100 KHz. However, it will be understood that the period 502 can be any other suitable amount of time based on the application in which the RF integrated gate driver 100 is implemented and its desired switching frequency. The switching performance of the RF integrated gate driver 100 can be based on the voltage of the rectifier output signal 124 and the resistances of both the turn-on gate resistance 108 and the turn-off gate resistance 206. Thus, this voltage value and these resistance values may be selected based on desired performance characteristics.

Figure 6:
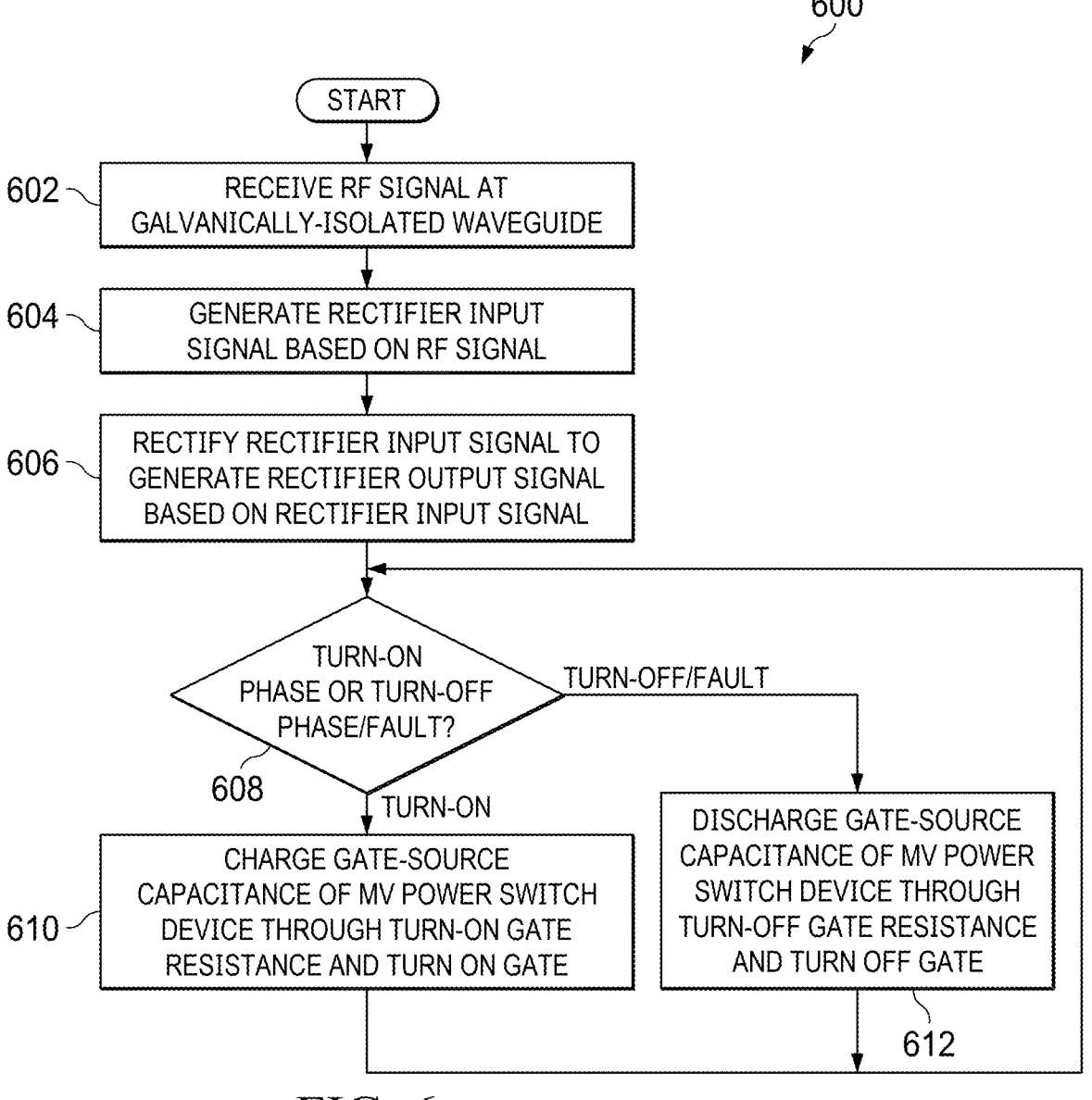
FIG. 6 illustrates an example of a method for driving a gate of a power switch device using the RF integrated gate driver of FIG. 1 according to this disclosure.

FIG. 6 illustrates an example of a method 600 for driving a gate 120 of a power switch device 102 using the RF integrated gate driver 100 according to this disclosure. As shown in FIG. 6, an RF signal 116 is received at a galvanically-isolated (GI) waveguide 104 at step 602. This may include, for example, receiving a 2.45 GHz, or other suitable frequency, RF signal 116 generated by an RF source 118. Depending on the application, the RF signal 116 can include a periodic or a non-periodic RF power source signal. A rectifier input signal 122 is generated based on the RF signal 116 at step 604. This may include, for example, the GI waveguide 104 generating the rectifier input signal 122 based on the RF signal 116. The rectifier input signal 122 is rectified to generate a rectifier output signal 124 based on the rectifier input signal 122 at step 606. This may include, for example, an RF rectifier 106 receiving the rectifier input signal 122 from the GI waveguide 104 and rectifying the rectifier input signal 122 to generate the rectifier output signal 124.

During a turn-on phase of the power switch device 102 as determined at step 608, a gate-source capacitance 130 of the power switch device 102 is charged through a turn-on gate resistance 108 and the gate 120 of the power switch device 102 is turned on at step 610. This may include, for example, the RF rectifier 106 providing the rectifier output signal 124 through the turn-on gate resistance 108 as the gate signal 128 to the gate 120 of the SiC MOSFET 126, thereby charging the gate-source capacitance 130 and turning on the gate 120. For particular embodiments, the turn-on gate resistance 108 can be less than 10Ω, less than 5Ω, less than 3Ω, or about 2Ω.

During a turn-off phase of the power switch device 102 (or when a fault condition is detected) as determined at step 608, the gate-source capacitance 130 of the power switch device 102 is discharged through a turn-off gate resistance 206 and the gate 120 of the power switch device 102 is turned off at step 612. This may include, for example, the switch circuit 136 closing the discharging switch 204 based on the inverted PWM signal 208 and thereby providing a current path through the turn-off gate resistance 206 instead of the turn-on gate resistance 108, which results in discharging of the gate-source capacitance 130 and turning off the gate 120 of the SiC MOSFET 126.

Thus, while the RF signal 116 continues to be received as described in connection with step 602 and no fault condition is detected by the protection circuit 114, the method continues to alternate between a turn-on and a turn-off phase at step 608, alternatively charging the gate-source capacitance 130 and turning on the gate 120 at step 610 or discharging the gate-source capacitance 130 and turning off the gate 120 at step 612. However, if the protection circuit 114 detects a fault condition at step 608, the gate-source capacitance 130 is discharged and the gate 120 is turned off at step 612, regardless of whether the power switch device 102 is in a turn-on or turn-off phase.

In this way, common issues for conventional gate drivers, such as device failures, conductive EMI problems, and the disruption of the control signals due to common mode currents, may be greatly decreased or eliminated based on the use of the GI waveguide 104, which has a low coupling capacitance. In addition, using the GI waveguide 104 allows for mitigation of EMI noise by using a waveguide-based power and signal transfer due to the low coupling capacitance between the power switch device 102 and the RF source 118. For embodiments in which the power switch device 102 includes an MV power switch device, this allows MV switching and a high voltage slew rate, along with its corresponding high reliability. This configuration also provides for fast triggering of gate turn-on and turn-off with an MV power converter, which allows a high switching frequency to be used. For a particular example, a switching frequency of over 100 kHz can be implemented, which results in a ten times higher power density as compared to switching frequencies of less than 5 kHz, such as those used in applications having conventional gate drivers.

Using this method 600 also allows for a smaller form factor compared to conventional transformer-based gate drivers. For some embodiments, the form factor may be at least ten times smaller than a transformer-based gate driver. In addition, being able to provide the gate signal 128 through a relatively low-resistance turn-on gate resistance 108 allows switching losses to be reduced by at least 30%, resulting in a higher efficiency and high power density at system level.

Although FIG. 6 illustrates one example of a method 600 for driving a gate 120 in a power switch device 102 using the RF integrated gate driver 100, various changes may be made to FIG. 6. For example, while shown as a series of steps, various steps in FIG. 6 may overlap, occur in parallel, occur in a different order, or occur any number of times (including zero times).

It may be advantageous to set forth definitions of certain words and phrases used throughout this patent document. The term "about" (when used with a numerical value) indicates that the numerical value may vary by up to ±10%. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 116(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 116(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A radio frequency (RF) integrated gate driver comprising:

a galvanically-isolated (GI) waveguide configured to receive an RF signal from an RF source and to generate a rectifier input signal based on the RF signal;

an RF rectifier configured to receive the rectifier input signal from the GI waveguide and to generate, based on the rectifier input signal, a rectifier output signal to drive a gate of a power switch device;

a turn-on gate resistance, wherein the RF rectifier is configured to provide the rectifier output signal as a gate signal through the turn-on gate resistance to turn on the gate and charge a gate-source capacitance of the power switch device during a turn-on phase of the power switch device; and a switch circuit coupled to the RF rectifier and the turn-on gate resistance, wherein the switch circuit is configured to provide the gate signal through a turn-off gate resistance to turn off the gate and discharge the gate-source capacitance of the power switch device during a turn-off phase of the power switch device.

2. The RF integrated gate driver of claim 1, wherein the power switch device comprises a medium voltage power switch device.

3. The RF integrated gate driver of claim 1, wherein:

the RF rectifier is further configured to provide direct current (DC) voltage and power to the gate; and the DC voltage is between about −5V and about +15V.

4. The RF integrated gate driver of claim 1, wherein the turn-on gate resistance comprises about 2Ω of resistance.

5. The RF integrated gate driver of claim 1, wherein the GI waveguide comprises one of a fiber optic waveguide or a dielectric waveguide.

6. The RF integrated gate driver of claim 1, wherein:

the power switch device comprises at least one Silicon Carbide (SiC) metal-oxide-semiconductor field-effect transistor (MOSFET); and the gate of the power switch device comprises a gate of the SiC MOSFET.

7. The RF integrated gate driver of claim 1, wherein one of:

the RF signal comprises a periodic RF power source signal and the RF rectifier comprises a passive diode rectifier; or the RF signal comprises a non-periodic RF power source signal and the RF rectifier comprises an active rectifier.

8. The RF integrated gate driver of claim 1, further comprising a protection circuit configured to detect a fault condition;

wherein, in response to the protection circuit detecting the fault condition, the switch circuit is further configured to provide the gate signal through the turn-off gate resistance to turn off the gate and discharge the gate-source capacitance of the power switch device without regard to whether the power switch device is in the turn-on phase or the turn-off phase.

9. A radio frequency (RF) integrated gate driver comprising:

a galvanically-isolated (GI) waveguide comprising one of a fiber optic waveguide or a dielectric waveguide, the GI waveguide configured to:

provide power isolation for the RF integrated gate driver to mitigate electromagnetic interference (EMI) noise; and generate a rectifier input signal based on an RF signal; and an RF rectifier configured to:

rectify the rectifier input signal to generate a rectifier output signal, and drive a gate of a power switch device based on the rectifier output signal.

10. The RF integrated gate driver of claim 9, wherein the power switch device comprises a medium voltage power switch device.

11. The RF integrated gate driver of claim 9, wherein:

the RF rectifier is further configured to provide DC voltage and power to the gate; and the DC voltage is between about −5V and about +15V.

12. The RF integrated gate driver of claim 9, further comprising a turn-on gate resistance, wherein the RF rectifier is configured to provide the rectifier output signal as a gate signal through the turn-on gate resistance to turn on the gate and charge a gate-source capacitance of the power switch device during a turn-on phase of the power switch device.

13. The RF integrated gate driver of claim 12, wherein the turn-on gate resistance comprises about 2 Ω of resistance.

14. The RF integrated gate driver of claim 12, further comprising a switch circuit coupled to the RF rectifier and the turn-on gate resistance, wherein the switch circuit is configured to provide the gate signal through a turn-off gate resistance to turn off the gate and discharge the gate-source capacitance of the power switch device during a turn-off phase of the power switch device.

15. The RF integrated gate driver of claim 14, further comprising a protection circuit configured to detect a fault condition;

wherein, in response to the protection circuit detecting the fault condition, the switch circuit is further configured to provide the gate signal through the turn-off gate resistance to turn off the gate and discharge the gate-source capacitance of the power switch device without regard to whether the power switch device is in the turn-on phase or the turn-off phase.

16. The RF integrated gate driver of claim 9, wherein:

the power switch device comprises at least one Silicon Carbide (SiC) metal-oxide-semiconductor field-effect transistor (MOSFET); and the gate of the power switch device comprises a gate of the SiC MOSFET.

17. The RF integrated gate driver of claim 9, wherein one of:

the RF signal comprises a periodic RF power source signal and the RF rectifier comprises a passive diode rectifier; or the RF signal comprises a non-periodic RF power source signal and the RF rectifier comprises an active rectifier.

18. A method comprising:

receiving a radio frequency (RF) signal from an RF source;

generating a rectifier input signal with a galvanically-isolated (GI) waveguide based on the RF signal;

rectifying the rectifier input signal to generate a rectifier output signal;

driving a gate of a power switch device based on the rectifier output signal by providing the rectifier output signal as a gate signal through a turn-on gate resistance to turn on the gate and charge a gate-source capacitance of the power switch device during a turn-on phase of the power switch device; and providing the gate signal through a turn-off gate resistance to turn off the gate and discharge the gate-source capacitance of the power switch device during a turn-off phase of the power switch device.

19. The method of claim 18, wherein the power switch device comprises a medium voltage power switch device.

20. The method of claim 18, further comprising:

detecting a fault condition; and in response to detecting the fault condition, providing the gate signal through the turn-off gate resistance to turn off the gate and discharge the gate-source capacitance of the power switch device without regard to whether the power switch device is in the turn-on phase or the turn-off phase.

* * * * *